United States Patent [19]

Haigh

[11] Patent Number: 4,651,089
[45] Date of Patent: Mar. 17, 1987

[54] FREQUENCY COUNTING ARRANGEMENT

[75] Inventor: James E. Haigh, St. Albans, England

[73] Assignee: Marconi Instruments Limited, St. Albans, England

[21] Appl. No.: 571,539

[22] Filed: Jan. 17, 1984

[30] Foreign Application Priority Data

Jan. 23, 1983 [GB] United Kingdom ................. 8301797

[51] Int. Cl.$^4$ ........................................... G01R 23/14
[52] U.S. Cl. ................................... 324/79 R; 328/133
[58] Field of Search .................. 331/17; 328/133, 134; 324/79 R, 79 D; 455/226; 364/484

[56] References Cited

U.S. PATENT DOCUMENTS

| | | | |
|---|---|---|---|
| 3,913,029 | 10/1975 | Iida ....................................... | 331/17 |
| 3,991,382 | 11/1976 | Caspari ................................. | 331/17 |
| 4,135,243 | 1/1979 | Peregrino ............................. | 364/484 |
| 4,310,891 | 1/1982 | Niki ..................................... | 364/484 |

FOREIGN PATENT DOCUMENTS

| | | |
|---|---|---|
| 3028333 | 2/1981 | Fed. Rep. of Germany . |
| 779233 | 7/1957 | United Kingdom . |
| 1277552 | 6/1972 | United Kingdom .................. 324/79 |
| 2089602 | 6/1982 | United Kingdom .................. 331/17 |
| 2055212B | 3/1983 | United Kingdom . |

OTHER PUBLICATIONS

Heinz Friedberg, an article from the German Periodical Nachrichten elektronik [Electronic Communications] entitled "Heterodyne-Umsetzer" ["Heterodyne Converter"], Dec., 1977, p. 345.

Ali Bologlu and Vernon A. Barber, an article in the Hewlett-Packard Journal entitled: "Microprocessor-Controlled Harmonic Heterodyne Microwave Counter also Measures Amplitudes", May, 1978, pp. 2 to 16.

Primary Examiner—Michael J. Tokar
Attorney, Agent, or Firm—Spencer & Frank

[57] ABSTRACT

A method and apparatus for determining the frequency of an input signal. The input signal and a sampling signal having a sampling frequency $f_s$ to a sampling mixer to produce a first intermediate frequency signal. The first intermediate frequency signal is applied to a detector having a response frequency bandwidth of at least $f_s/2$ to determine whether the frequency value of the input exceeds a threshold value. The frequency value of the sampling signal is changed from among a plurality of frequency values and applied to the mixer until one of such frequency values results in a second intermediate frequency signal in a predetermined frequency range which is smaller than and lying within the detector bandwidth. The second intermediate frequency signal is applied to a frequency counter which produces a count corresponding to the second intermediate frequency. The frequency of the input signal is calculated by utilizing the count of the second intermediate frequency, the value of the sampling frequency $f_s$ and the harmonic number of the sampling mixer which produced the count of the second intermediate frequency.

9 Claims, 3 Drawing Figures

FREQUENCY COUNTING ARRANGEMENT

BACKGROUND OF THE INVENTION

This invention relates to frequency counting arrangements which are able to determine the frequency of an applied signal to a very high degree of accuracy. Although relatively low frequency signals can easily be counted by digital counters operating at moderate speed, it is much more difficult to determine the value of a very high frequency signal if its frequency is above the frequency at which digital counters can operate. The present invention seeks to provide a frequency counting arrangement in which this difficulty is reduced. The counting arrangement is particularly suitable for use in conjunction with a modulation meter in which it is customary to convert an incoming signal to a predetermined intermediate frequency value in order to perform accurate measurements upon it related to its amplitude, phase and/or frequency modulations. Once the actual value of the frequency of the incoming signal is known it is a relatively simple matter to convert it to the required intermediate frequency value at which the modulation meter is designed to operate.

SUMMARY OF THE INVENTION

According to a first aspect of this invention a method of determining the frequency of an input signal includes the steps of: applying the signal to a sampling mixer which receives a sampling signal having a sampling frequency $f_s$ of a desired initial value to produce a first intermediate frequency signal which is applied to a detector having a response frequency bandwidth of at least $f_s/2$ to determine the existence of the input signal; changing the value of the sampling frequency $f_s$ applied to the mixer to obtain a second intermediate frequency signal in a predetermined frequency range which is smaller than and lying within the detector bandwidth; counting the second intermediate frequency directly by means of a frequency counter; and calculating the frequency of the input signal by utilising the counted second intermediate frequency value, and the value of the sampling frequency $f_s$ and the harmonic number of the sampling mixer which produced the counted second intermediate frequency.

According to a second aspect of this invention, a frequency counting arrangement includes a sampling mixer arranged to receive a sampling signal having a sampling frequency $f_s$ of a desired initial value from a local oscillator, and to sample an applied input signal to produce a first intermediate frequency; a first detector having a response frequency bandwidth of at least $f_s/2$ to which the first intermediate frequency is applied, the first detector being arranged to detect the presence of the first intermediate frequency if it lies within the first detector's bandwidth; a second detector having a response frequency bandwidth which is smaller than and lies within the response frequency bandwidth of the first detector; means for controlling the local oscillator to produce a second intermediate frequency signal lying within the response frequency bandwidth of the second detector; counter means for counting the second frequency; and means utilising the counted second intermediate frequency value, and the value of the sampling frequency $f_s$ and the harmonic number of the sampling mixer which produced the counted second intermediate frequency to calculate the frequency of the applied input signal.

Some frequency values of the input signal will produce a first intermediate frequency which lies at one or another of the extreme ends of the frequency bandwidth of the detector such that it can not be detected, and to determine the existence of such a signal the value of the sampling frequency $f_s$ is switched between at least two values chosen so that each value will result in the detection of an input signal which is obscured by the other value.

It is only when the detector records the existence of an input signal, that the sequence of sampling frequencies is applied to the sampling gate to generate the second intermediate frequency. The range of possible values of the second intermediate frequency, which is such as to lie at least approximately about the center of the detector bandwidth, is chosen such that the range can accurately be counted directly by a frequency counter. A low pass filter at the output of the mixer ensures that only the required harmonic is fed to the detectors and the counter, since if more than one frequency is fed to the counter an incorrect value might result. Also, any frequency counter has a range over which it can operate with a given degree of accuracy, but its accuracy is inevitably less at very low frequency values (where capacity of its registers is greatly under utilized, giving rise to large uncertainties as to the value measured) and at very high frequency values corresponding to the upper rate at which its registers can operate (as some cycles can be missed if the counting stages of the registers do not react sufficiently quickly).

The sequence of sampling frequencies is carefully chosen to permit detection of any frequency value (above a certain threshold value) whilst minimising the number of different frequencies in the sequence, since the length of the sequence materially affects the response time of the counting arrangement as a whole —that is to say the time which elapses from the application of an unknown input signal until the determination of its actual value.

BRIEF DESCRIPTION OF THE DRAWINGS

The invention is further described by way of example with reference to the accompanying drawings in which.

DESCRIPTION OF THE PREFERRED EMBODIMENT

Figure 1:
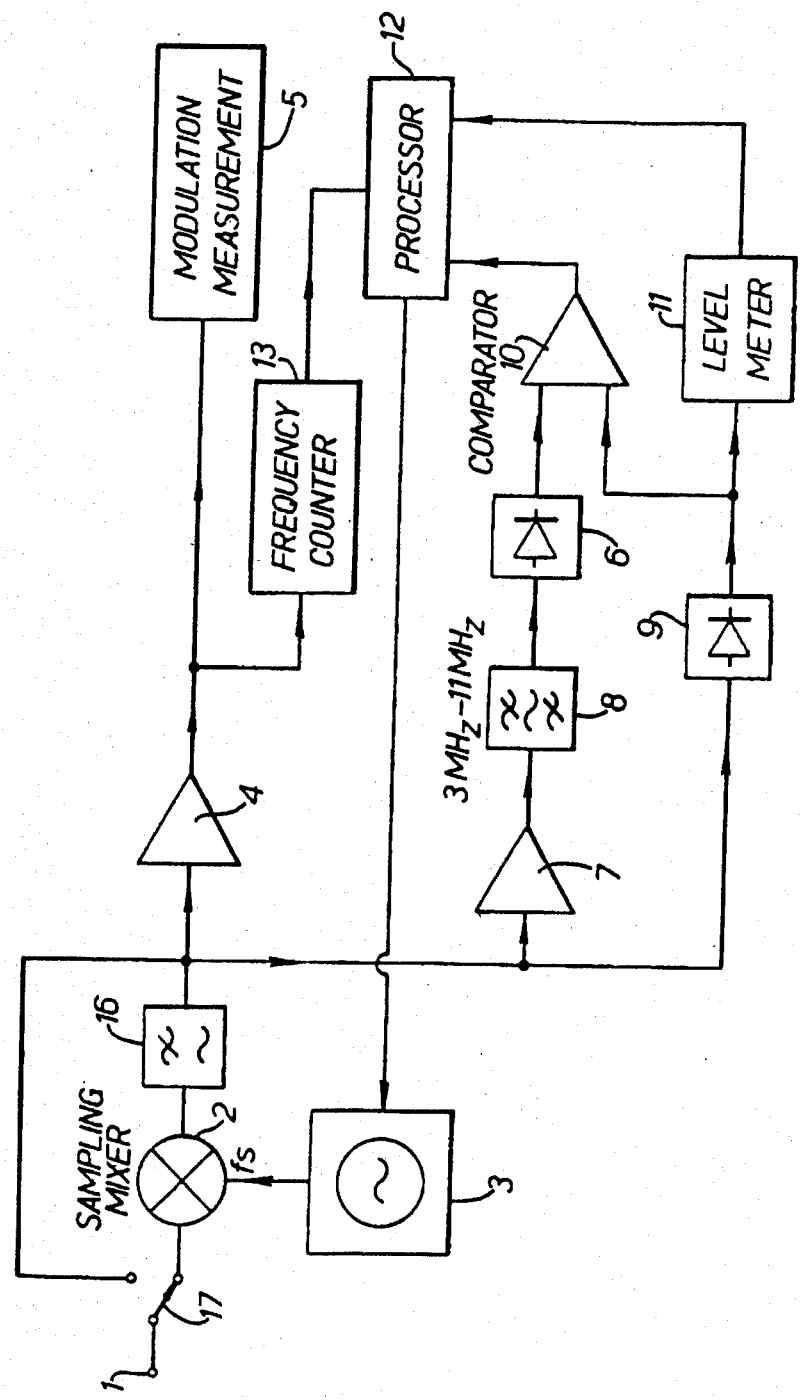
FIG. 1 is a block circuit diagram which illustrates a frequency counter according to the invention.

The frequency counter shown in FIG. 1 is suitable for use in combination with a modulation meter which is operative to receive frequencies over an extremely wide bandwidth and to determine precisely the characteristics of frequency modulation, phase modulation or amplitude modulation. It is customary for the modulation detection circuit to work at a predetermined intermediate frequency and it is therefore necessary to convert the carrier frequency of an incoming signal to the required intermediate frequency value. This is not a straightforward task if the input frequency may lie anywhere within a very wide frequency band. The frequency counter shown in FIG. 1 is intended to accept input frequencies lying within the band extending from about 500 kHz to 2 GHz.

Referring to FIG. 1 in more detail, an input signal of unknown frequency is applied to input terminal 1 and is fed to one input of a sampling mixer 2 where it is mixed with a sampling signal having an initial sampling frequency value which is provided by a variable frequency local oscillator 3. The output of the sampling mixer 2 is fed via a low pass filter 16, having a cut off frequency of about 15 MHz and an intermediate frequency amplifier 4 to a circuit 5 which measures the modulation on the signal applied to it. To permit accurate measurement of the amplitude, phase or frequency modulation to take place it is necessary that the signal provided to the circuit 5 has precisely predetermined intermediate frequency value. In order to permit the frequency $f_s$ of the oscillator 3 to be set to the appropriate value to generate the necessary intermediate frequency value at the sampling mixer 2, the remainder of the circuit shown in FIG. 1 is used to determine, with a high degree of accuracy, the actual frequency of the input signal applied to terminal 1.

The output of the sampling mixer 2 is applied also to a first detector 6 via an amplifier 7 and a band pass filter 8 which has a band pass extending from 3 MHz to 11 MHz. The output of the mixer 2 is also applied directly to a second detector 9, the output of which is applied to one input of a comparator 10, the other input being received from the first detector 6. The output of the detector 9 is also applied directly to a level meter 11 which acts to monitor the output of the signal detected by the detector 9. The output of the comparator 10 and the level meter 11 are applied to a central processor 12.

The output of the amplifier 4 is applied not only to the circuit 5 but also to a high accuracy digital counter 13, the output of which also feeds the central processor 12. The operation of the processor is such as to control the frequency of oscillation of the variable local oscillator 3 which in practice could be a frequency synthesizer, so as to set the value of the sampling signal to a desired frequency value.

The operation of the frequency counting arrangement is as follows; the first step of the operation is to determine the existence of an input signal at terminal 1, and the local oscillator 3 is initially set to a frequency f1 such that any signal applied to the input terminal 1 which is within the frequency range of the mixer 2 will produce an intermediate frequency in the range 0-f1/2. The switch 17 is set as illustrated in FIG. 1 the level of this intermediate frequency is measured by the detector 9 which is arranged to have a sufficiently wide bandwidth i.e. a bandwidth extending from d.c. to at least f1/2. In practice those signals which are close in frequency to the harmonics of the frequency f1 produce an intermediate frequency which is close to zero frequency. To overcome this difficulty, the oscillator 3 is switched repetitively between two intermediate frequency values several times a second, and these two frequencies are chosen so that no harmonic of one frequency falls on a harmonic of the other frequency within the whole frequency range of the frequency counting arrangement. Typically, the two frequencies which are applied by the oscillator 3 to the sampling mixer 2 have the values 28.1 MHz and 28.4 MHz. The use of these values ensures that any useful intermediate frequency will have the value of less than 14.2 MHz and it is the frequencies below this value which are applied to the wide bandwidth detector 9. The oscillator 3 has an operating range of 28 MHz to 56 MHz, and the response bandwidth of the detectors 6 and 9 extend up to approximately 14 MHz.

The detector 9 produces a DC level in response to an applied input frequency lying within its operating bandwidth, and this DC level is applied to the level meter 11 which generates an output signal if the level is above the minimum threshold value. Clearly it is undesirable for the level meter 11 to respond to spurious noise and the threshold value is set accordingly, but at not such a high level as to exclude wanted low level signals. An output signal from the level meter 11 indicates that a measurable input frequency has been applied to terminal 1 but its actual frequency value is quite unknown, and this output signal is applied to the processor 12, so that the frequency counting arrangement can perform the next phase of the operation, which is to determine, with a degree of precision, the actual value of the frequency present at terminal 1.

Figure 2:
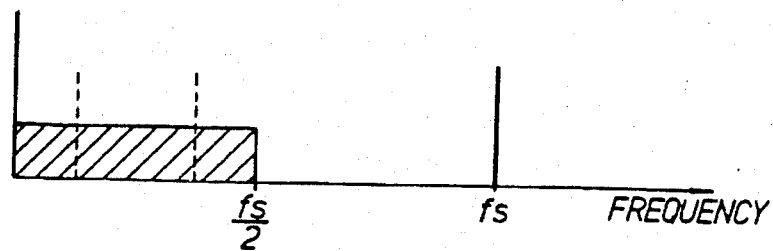
FIGS. 2 and 3 are explanatory diagrams.

In FIG. 2, the frequency value of the local oscillator is shown as $f_s$, and the response bandwidth of the detectors 6 and 9 is shown by the hatched area extending from zero frequency to $f_s/2$. In practice the response of the detectors, which in practice are simply diodes, does not extend quite to zero frequency.

In FIG. 1 it is assumed that the useful frequency range of the counter 13 extends over the central half octave of the bandwidth (0 to 14 MHz) of the detectors 6 and 9. The half octave band extends from 3.5 MHz to 10.5 MHz, but the circuits are arranged to accept frequencies in the slightly wider band of 3 MHz to 11 MHz. The frequency counter 13 is theroetically capable of operation over the band 0-14 MHz, but for well known reasons the degree of accuracy and precision which is available from a frequency counter deteriorates significantly at the upper and lower ends of its usable range. Thus, during this phase of the frequency determining operation, intermediate frequencies are applied to the counter 13, such that they lie only within the relatively narrow band of 3 MHz to 11 MHz. In practice the value of the sampling frequency $f_s$ provided by the oscillator 3 is altered in accordance with a predetermined sequence of values until an intermediate frequency is found which is within this relatively narrow band so that it can subsequently be counted.

The sequence of sampling frequency values which is applied to the mixer 2 is chosen so that all possible values of input signal above a threshold frequency value will result in at least one intermediate frequency lying within the required band of 3 MHz to 11 MHz. There are various ways in which the sequence can be arranged. If the narrow band is assumed to be from 3.5 to 10.5 MHz, i.e. 7 MHz wide, then a simple approach would be to use the frequencies required to shift each harmonic of interest by 7 MHz. If the entire frequency range up to 2 GHz is to be covered using a value of $f_s$ of 28 MHz, this would require a sequence of 72 different frequencies. In practice this large number can be greatly reduced, using a binary halving technique, to a sequence of only 7 different values. When it has been determined whether the initial value of frequency $f_s$ of 28.1 MHz or 28.4 MHz is to be used (for the reason mentioned previously), the following offset values are added to the selected frequency: 0.11 MHz, 0.22 MHz, 0.44 MHz, 0.88 MHz, 1.76 MHz, 3.52 MHz and 7.04 MHz to form the required sequence of seven different values of the sampling frequency $f_s$. The various frequency values are stored within the processor, and accessed when required to enable the variable local oscillator 3 (which in practice comprises a frequency synthesizer) to be set accordingly.

Figure 3:
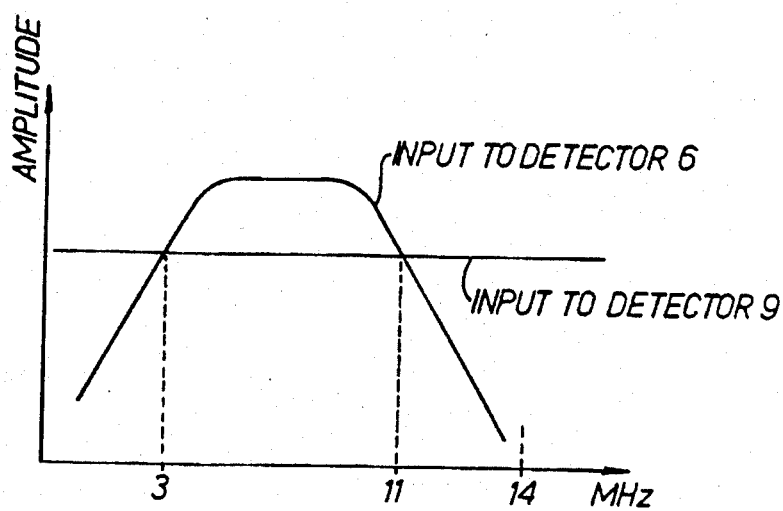

The amplifier 7 and band pass filter 8 in combination ensure that the amplitude of a signal lying within the band 3 MHz to 11 MHz which is applied to the detector 6 is of significantly greater amplitude than that applied to the detector 9. The frequency amplitude characteristics of the two signals applied to the detectors 6 and 9 are shown in FIG. 3, from which it will be seen that detector 6 receives the higher level signal only over the range 3 to 11 MHz. When the amplitude of the output signal from the detector 6 is greater than that from the detector 9, the comparator 10 switches state and provides an output signal to the processor 12 to indicate that the input signal lies within the band of frequencies which can be accurately measured by the counter 13. The processor 12 then instructs the counter 13 to actually count the frequency value of the output signal from the sampling mixer.

It is possible that an output signal will not be generated by the comparator 10 even though the full sequence of values of $f_s$ is applied to the sampling mixer, and this will be so if the input frequency has a value which is less than 3.5 MHz or lies in the relatively low frequency band of 10.5 MHz to 17.5 MHz. In this case the counter 13 is now instructed by the processor 12 to count the input frequency directly, and the switch 17 is set so as to by-pass the mixer 2 and the filter 16.

In order to identify the true value of the carrier frequency (of the input signal at terminal 1) the harmonic number H of the output of the sampling mixer 2 must be determined, since the carrier frequency $= f_s \times H \pm f1$ where f1 is the intermediate frequency at the output of the mixer 2. This is done by side stepping the frequency of the local oscillator 3 by a small amount which is typically about 40 kHz, and noting the change in the intermediate frequency output of the sampling mixer 2. It is possible that the sign of side step takes the value of the intermediate frequency outside the measurable range of 3 MHz to 11 MHz, and in this case the local oscillator 3 is stepped in the other direction by the same value of 40 kHz. In conventional fashion, the harmonic number is given by the change in the value of the intermediate frequency divided by the change in the value of the local oscillator frequency which produced it. Furthermore, the + or − sign in the above equation is determined by noting whether a decrease in the value of $f_s$ produces an increase or decrease in f1; use + sign if an increase, and − sign if a decrease results, and vice versa for an increase in $f_s$. These factors thus enable the precise value of the input carrier frequency to be calculated.

The modulation measurement circuit 5 is designed to perform its measurement on an intermediate frequency which has a centre value of 1.5 MHz. Knowing the value of the input frequency, the processor 12 calculates a value for the local oscillator frequency $f_s$ such that the resulting intermediate frequency is as close as possible to the required value of 1.5 MHz. In practice a small tolerance of ± about 150 kHz is allowed. The frequency of the local oscillator 3 is set to the required value, and the actual measurement of the modulation then proceeds. If the intermediate frequency drifts such that it becomes more than 150 kHz from its calculated value, the processor recalculates the required value of $f_s$ to restore the required value, but if the total frequency drift exceeds 250 kHz, the incoming frequency at terminal 1 is completely re-evaluated by repeating the frequency counting process.

I claim:

1. A method of determining the frequency of an input signal including:
    applying the input signal and a sampling signal having a desired initial value of sampling frequency $f_s$ to a sampling mixer to produce a first intermediate frequency signal;
    applying the first intermediate frequency signal to a first detector having a response frequency bandwidth of at least $f_s/2$ to determine whether the input signal has a measureable frequency;
    changing the frequency value of the sampling signal applied to the mixer, from among a plurality of frequency values, until one of such values results in a second intermediate frequency signal in a predetermined frequency range which is smaller than and lying within the bandwidth of the first detector, and with each said second intermediate frequency signal having a harmonic number of the sampling mixer associated with it;
    applying the second intermediate frequency signal to a frequency counter which produces a count corresponding to the second intermediate frequency; and
    calculating the frequency of the input signal by utilizing the count of the second intermediate frequency, and the value of the sampling frequency $f_s$ and the harmonic number of the sampling mixer which produced the count of the second intermediate frequency.

2. A method as claimed in claim 1, and further comprising applying the second intermediate frequency signal to a second detector, with the second detector being arranged to exhibit a restricted response frequency bandwidth which is approximately half that of the first detector and lies centrally within it.

3. A method as claimed in claim 2, and further comprising arranging the amplitude of the output of one of the first and second detectors to be greater than the amplitude of the output of the other of these detectors for those intermediate frequency values which lie within the response frequency bandwidth of the second detector, and to be less than the amplitude of the output of the other of these detectors for other intermediate frequency values.

4. A method as claimed in claim 2, and further comprising applying a plurality of frequency values of the sampling signal to the sampling mixer to produce a corresponding plurality of second intermediate frequencies which are applied to the first and second detectors; and determining which, if any, of the frequencies fall within the restricted response frequency bandwidth of the second detector.

5. A method as claimed in claim 4, and further comprising choosing the plurality of frequency values of the sampling signal so as to result in at least one of the intermediate frequencies falling within the restricted response frequency bandwidth for all possible input signals lying above a predetermined threshold frequency and below an upper frequency limit.

6. A method as claimed in claim 5, and further comprising counting the output of the sampling mixer directly if no such second intermediate frequencies are detected within the restricted response frequency bandwidth, it being assumed that the input signal is below the predetermined threshold frequency.

7. A method as claimed in claim 1, and further comprising using the calculated frequency value of the input signal to set the frequency value of a sampling signal which is applied to the sampling mixer to generate a third intermediate frequency signal having a predetermined frequency, such that modulation measurements can be performed upon such third intermediate frequency signal.

8. A frequency counting arrangement including:
   a sampling mixer having first and second mixer inputs and a mixer output;
   a local oscillator having a control input and an output connected to said first mixer input for feeding a sampling signal having a frequency $f_s$ of a desired initial value to said sampling mixer;
   an input terminal connected to said second mixer input for feeding an input signal of initially unknown frequency value to said sampling mixer, said sampling mixer producing a first intermediate frequency signal on said mixer output;
   a first detector connected to said mixer output for receiving the first intermediate frequency signal, said first detector having a response frequency bandwidth of at least $f_s/2$ and detecting the presence of said first intermediate frequency if it lies within said bandwidth;
   a second detector connected to said mixer output and having a response frequency bandwidth which is smaller than and lies within the response frequency bandwidth of said first detector;
   control means connected to the control input of said local oscillator for controlling said local oscillator to change the frequency value of the sampling signal so that said sampling mixer produces a second intermediate frequency signal lying within the response frequency bandwidth of said second detector and associated with a harmonic number of said sampling mixer;
   counter means connected to said mixer output for counting said second intermediate frequency; and
   utilization means connected to the outputs of said counter means and said first and second detectors for utilising said counted second intermediate frequency value, and the value of the sampling frequency $f_s$ and the harmonic number of the sampling mixer which produced said counted second intermediate frequency to calculate the frequency of the applied input signal.

9. A frequency counting arrangement as claimed in claim 8 further including means, responsive to the calculated frequency of the input signal and connected to the control input of said local oscillator, for controlling said local oscillator in conjunction with said sampling mixer to generate a third intermediate frequency signal at a predetermined frequency; and wherein a modulation measurement circuit is connected to the output of said sampling mixer and is responsive to said third intermediate frequency signal to perform modulation measurements upon it.

* * * * *